United States Patent [19]
Schwing et al.

[11] Patent Number: 5,656,335
[45] Date of Patent: Aug. 12, 1997

[54] PROCESS FOR COATING A SUBSTRATE WITH A MATERIAL GIVING A POLISHED EFFECT

[76] Inventors: Thomas Schwing, Brückenstrasse 24, 36391Sinntal-Mottgers; Jürgen Schwing, Brückenstrasse 24, 36391 Sinntal-Motgers, both of Germany

[21] Appl. No.: 307,577
[22] PCT Filed: Mar. 24, 1993
[86] PCT No.: PCT/EP93/00704
§ 371 Date: Dec. 8, 1994
§ 102(e) Date: Dec. 8, 1994
[87] PCT Pub. No.: WO93/19219
PCT Pub. Date: Sep. 30, 1993

[30] Foreign Application Priority Data

Mar. 24, 1992 [DE] Germany .................. 42 09 406.2

[51] Int. Cl.⁶ .................................... B05D 1/02
[52] U.S. Cl. .................. 427/447; 427/195; 427/223; 427/250; 427/294; 427/314; 427/404; 427/407.1; 427/422; 427/534; 427/535
[58] Field of Search ................ 427/447, 475, 427/534, 535, 573, 576, 586, 597, 195, 223, 250, 294, 314, 404, 407.1, 422

Primary Examiner—Bernard Pianalto
Attorney, Agent, or Firm—Dennison, Meserole, Pollack & Scheiner

[57] ABSTRACT

A process for coating a substrate with a metal giving a polished effect, the substrate being of a material that is dimensionally stable at temperatures up to at least 120° C. The process includes the steps of cleaning the substrate or forming a top coating on the substrate by burning on a powdered lacquer, coating the cleaned or coated substrate with a metal giving a polished effect by plasma deposition within a vacuum chamber, and applying a top coating by burning on a powdered lacquer.

14 Claims, 3 Drawing Sheets

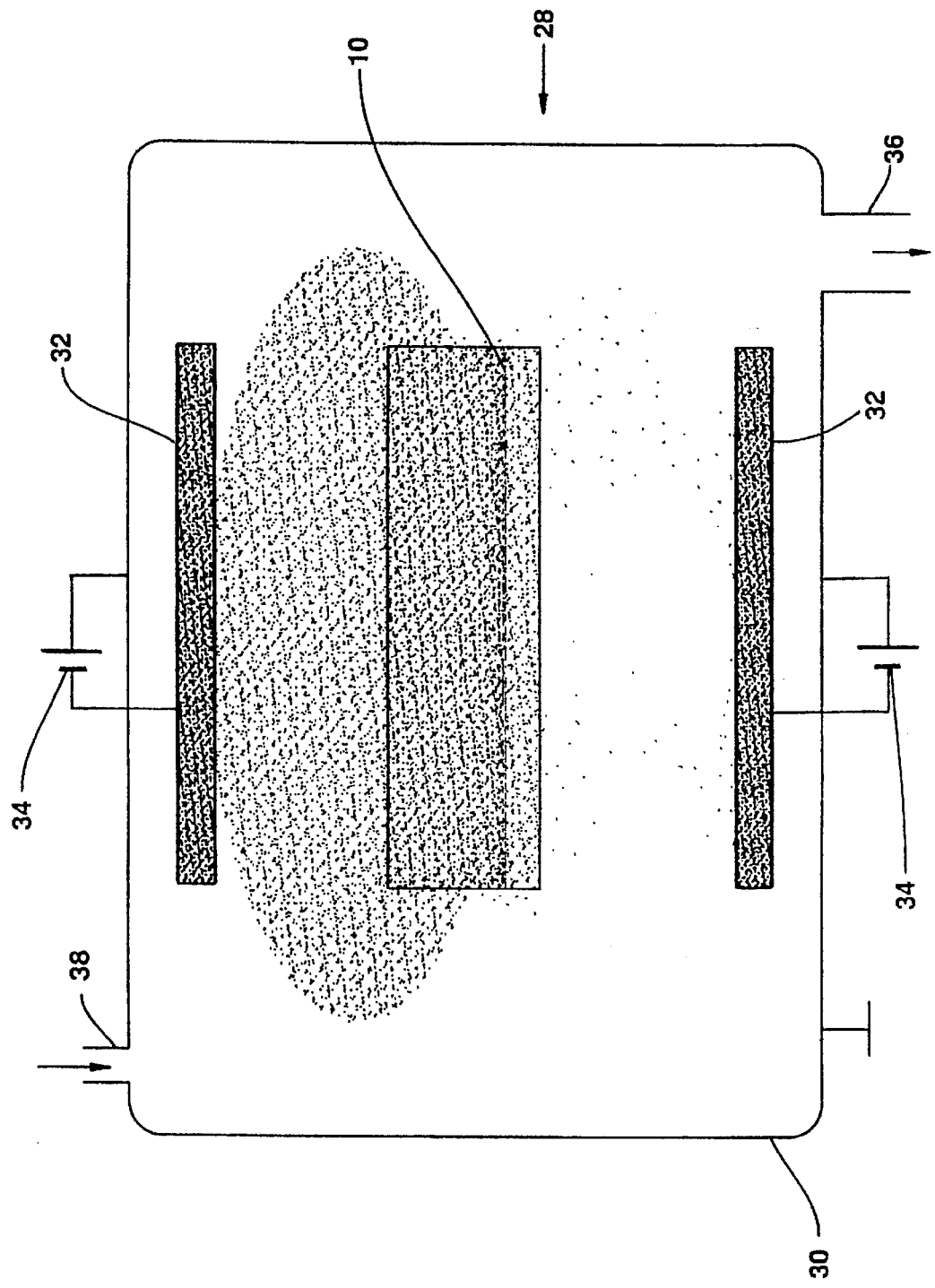

PROCESS FOR COATING A SUBSTRATE WITH A MATERIAL GIVING A POLISHED EFFECT

BACKGROUND OF THE INVENTION

The present invention relates to a process for coating a substrate with a material, such as a metal, giving a polished effect.

In order to achieve the effect of a high polish on object, according to the prior art electroplating with chromium, nickel, or anodizing are used. When this is done, costly pretreatments of the base material, such as surface polishing, are required in order to achieve the desired effect of a high polish. Further-more, some materials cannot be given a lasting high-lustre metallic finish, as in the case, for example, of chromium on aluminum. In addition, certain processes also entail the disadvantage of contributing to considerable environmental damage.

It is known that PVD or CVD processes can be used in conjunction with a wet-lacquer technique in order to achieve metallizing, although the required durability cannot be achieved in those areas that are endangered by corrosion. The mechanical and chemical stability of wet lacquers is not sufficient for coating parts that are highly stressed. Very frequently, corrosion protection leaves a great deal to be desired, and wet lacquering also gives rise to environmental hazards.

It is the task of the present invention to describe a process of the type described in the introduction hereto, by which high-lustre metallizing can be achieved without causing any environmental damage, and by which almost any desired geometry can be achieved at a consistent quality.

This problem has been solved by a process that comprises the following steps:

a) Cleaning of the substrate and/or application of a base coating on the substrate;

b) Coating the cleaned and/or base-coated substrate with the material giving the polished effect, by deposition, optionally with the help of plasma;

c) Application of a top coating by burning on, to which, if required, a protective coating can be applied.

A powder lacquer coating us used as the base coating, and this is burned on at a substrate temperature of 120° to 240° C.; this burning-in lasts for approximately 8 to 30 minutes.

As a consequence, according to the present invention, it is possible to coat substrates that do not exhibit any deformation in the above temperature range. Such substrates can be of metal, ceramic, glass, plastics, and, in particular, fibre-reinforced plastic. The application of the base coat ensures that the substrate surface is flat, i.e., that rough surfaces can be "metallized" without any mechanical processing; the powder lacquer coating that is to be burned on smoothes the surface in such a way that any rough spots the were originally present are covered over.

The powder is preferably a polyester resin compound, with deposition onto the surface being effect electrostatically. After that, the material that gives the polished effect is applied by the plasma process. Aluminum, chromium, titanium, silver, and gold are examples of suitable materials. To this end, the substrate is placed in a reaction chamber, in which the pressure is initially at least $10^{-4}$, preferably $10^{-4}$ to $10^{-5}$ millibar. This means that, in particular, oxygen and nitrogen molecules are removed to the required extent. The reaction chamber is then flooded with a process gas (inert gas of reactive gas) until the pressure is between 1 millibar and $10^{-3}$ millibar. Finally, a glow discharge is triggered, and a plasma results. The material that gives the desired polished effect is then vapourized in this plasma, so that the vapourized metal is deposited onto the substrate that is in the plasma.

The required plasma can be generated either within the reaction chamber by building up an electrical field between an anode (recipient) and a cathode (substrate) by means of DC current or high frequency (kHz - MHz, preferably 13.56 MHz), or outside the reaction chamber by a high-frequency field (GHz, microwave).

If the plasma is generated by high frequency, it must be ensured that the substrate surface is smaller than the recipient surface in order to ensure sufficient polarization of the electrodes.

The coating can also be effected by means of an arc vapourizer, a laser vapourizer, or by cathodic sputtering (single or double cathode). If this type of coating is used, separate generation of the plasma is eliminated, for the plasma is generated by the vapourizing or sputtering process.

After metallizing, a protective coating can be formed in an intermediate step, for example, by plasma polymerization, and the top coating is applied to this. This top coating is comparable to the base layer with respect to structure and production, i.e., in that a powder consisting preferably of a polyester resin compound is deposited electrostatically and then burned on at a temperature range between 120° C. and 240° C. for a period of 8 to 30 minutes.

Finally, a scratch-proof protective coating can be applied, this consisting preferably of a carbon compound.

Additional details, advantages, and features of the present invention are set out not only in the claims that describe these features, but also from the following description on an embodiment that is shown in the drawings appended hereto.

BRIEF DESCRIPTION OF THE DRAWINGS

FIG. 3 shows A diagram illustrating the principles of a plasma chamber.

DESCRIPTION OF THE PREFERRED EMBODIMENTS

Figure 1:
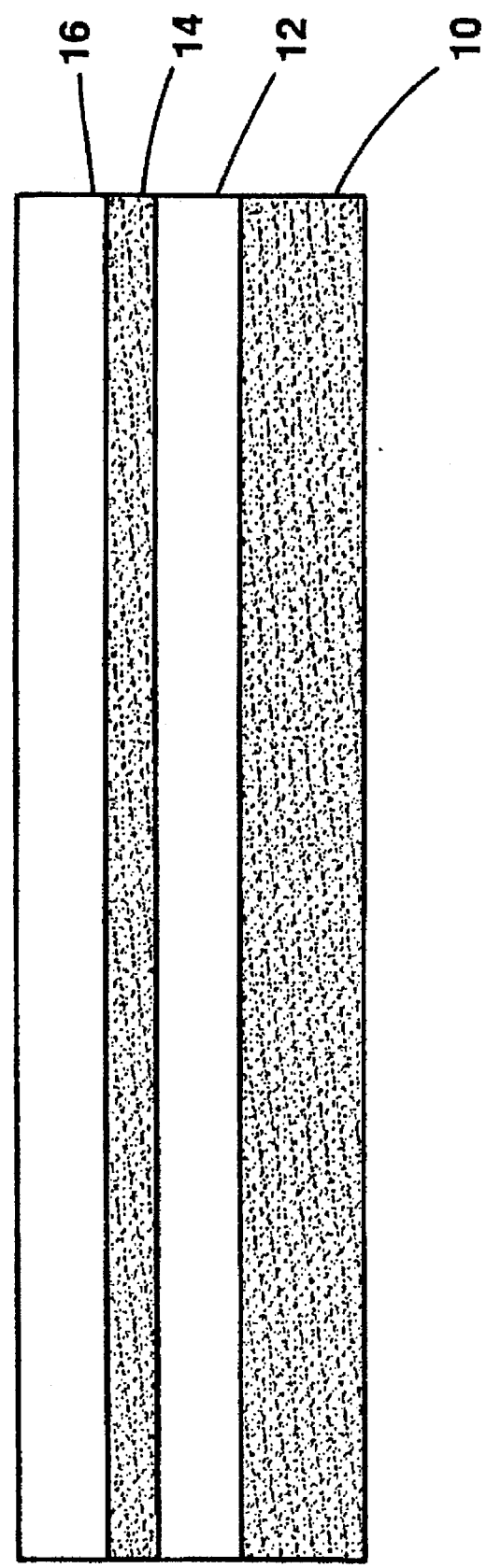
FIG. 1 shows a coating structure of a material giving a polished effect.

A powder of a polyester resin compound is applied electrostatically to a substrate (10) that can be of any geometry, and then burned on at a substrate temperature of approximately 120° C. to 240° C. for a period from 8 to 30 minutes, in order to produce a base coating (12) that is from 25μ to 125μ thick. This ensures that any surface roughness of the substrate (10) that was originally present is smoothed out. Alternatively, or in addition, the surface of the substrate (10) can be cleaned.

The substrate (10) can be of any material, such as metal, ceramic, glass, or plastics, providing that the secondary requirement, that the required dimensional stability is maintained at the burn-on temperature that is used, be satisfied.

Then, the substrate (10) with the base coat is placed in a reaction chamber that is initially act at a pressure that is between $10^{-4}$ and $10^{-5}$. In this way, oxygen and nitrogen molecules, which could possibly lead to undesirable reactions, are removed.

Next, the reaction chamber is flooded with a process gas, preferably argon, when a final pressure between 1 and $10^{-3}$ millibars is set.

In order to achieve a high-lustre effect on objects, according to the prior art, electroplating using chromium or nickel, or anodizing, are used. When this done, costly pretreatments of the base material, such as surface polishing, are needed in order to arrive at the desired high-lustre effect. In addition to this, certain materials cannot be metallized to give a high lustre that is lasting; this is the case, for example, with chromium on aluminum. In addition, such procedures also entail the disadvantage that they can give rise to environmental damage. A metal such as aluminum, chromium, titanium, silver, or gold is vapourized in the plasma that is formed, in order to coat the substrate (10) that is in the reaction chamber, which is to say, to provide the base coating (12) or the substrate that has been cleaned with the coating (14) that gives the polished effect.

Once the coating (14) has been applied, in a subsequent step of the process a top coating (16) is applied by means of electrostatic powder coating; when this is done, the process sequence corresponds to the one that results in the formation of the base coating (10). The top coating (16) should also be between 25μ and 125μ thick. The top coating provides for good mechanical and chemical resistance. In this way, the thickness of the coatings (12), (11), and (16) amounts to a total of approximately 50μ to 250μ.

In order to vary the polished effect to the extent that is desired, a matt or glossy powder lacquer can be used as the base coating (12) or the top coating (16), and this has to be clear transparent to colours for the top coating (16).

If so desired, a final coating (not shown herein) can be applied in an additional process step, this consisting of a carbon compound that is highly resistant to scratching.

Figure 2:
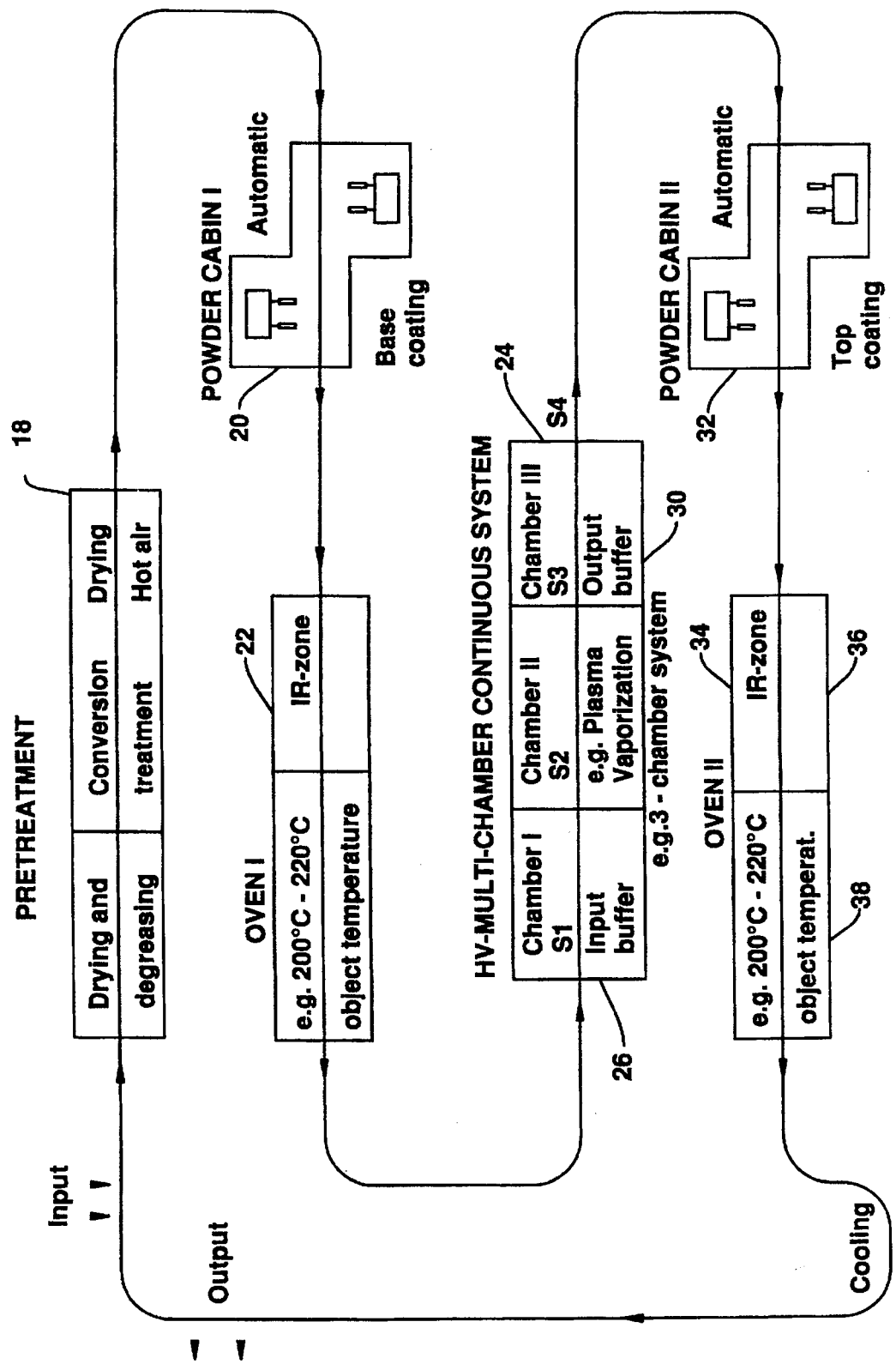
FIG. 2 shows A process diagram.

FIG. 2 is a process diagram for a continuous system for coating shaped bodies such as rims, for example.

The shaped body (substrate (10)) is cleaned and degreased in a pretreatment zone (18), so that it can be subjected to conversion treatment. This is followed by drying with hot air. Then the shaped body (10) is moved into powder cabin I (20) in which the base coating (12), preferably a powder lacquer coating, is applied automatically. This application of the powder lacquer coating in the powder cabin I can be carried out electrostatically.

After leaving powder cabin I (20) the shaped body (10) is moved into oven I (22), within which it first passes through an infrared zone in order that the shaped body is heated to a desired substrate temperature, e.g., in the range from 200° C. to 220° C. Once the base coating (12) has been burned on, [the shaped body (10)] passes through a high-vacuum multi-chamber continuous system (24) that, in the embodiment shown, comprises the chamber (26), (28), and (30). The chamber (26) is an input buffer, and the chamber (30) is an output buffer. The actual application of the material that gives the polished effect is made in chamber (28), it being preferred that this be done by plasma vapourization.

After leaving the chamber (30), the shaped body (10) is moved to powder cabin II (32), in which a top coating (16) in the form of a powder lacquer coating is applied, preferably by electrostatic deposition. It then passes through oven II (34) that incorporates an infrared zone (36) and a burn-on zone (38); within this oven, the object (10) is heated to the desired temperature, e.g., to approximately 200° C. to 220° C. the system.

The high-vacuum multi-chamber continuous system (24) consists, for example, of the three vacuum chambers (26), (28), and (30) that are of equal dimensions, and which are separated from each other by locks (51), (52), (53), and (54). The shaped bodies (10) first pass through the lock (S1) into the input buffer (26). This is evacuated to the pressure that is set in the process chamber (28). After it has reached this pressure, the locks S2 and S3 are opened. The body that is is the plasma chamber (28) now moves into the output buffer (30) and the body that is in the input buffer (26) moves into the process chamber (28). Next, the locks (S2) and (S3) are closed. The input buffer (26) and the output buffer (30) are now ventilated and then the locks (S1) and (S4) are opened. The body (10) that has been vapour-coated can now be moved out of the output buffer (30) and the next body (10) can be moved into the input buffer (26). Parallel to this, the body (10) that is in the plasma chamber (28) is being vapour coated The advantage of this system is that the cycle time is brief, since there is always a vacuum within the process chamber (28), and working processes such as evacuation, ventilation, and vapour-coating can be carried out in parallel.

FIG. 3 illustrates the principle of the plasma chamber (28). The plasma chamber comprises a housing (30) that is grounded and in which the substrate (10) that is to be coated with the material that gives the polished effect is arranged. The substrate (10) is located between the cathodes (32) that are connected to the negative poles of DC sources (31).

Thus, plasma can form between the cathodes (32) and the substrate (10).

The housing (30) can be connected to a vacuum pump by way of a connector (36). The required process gas itself is introduced through the connector (38).

What is claimed is:

1. A process for coating a substrate with a metal giving a polished effect, the substrate being dimensionally stable at a temperature of at least 120° C., comprising the steps of:

a) cleaning the substrate;

b) coating the cleaned substrate with the metal giving the polished effect by plasma deposition in a vacuum chamber; and c) coating the metal coated substrate by burning on a powdered lacquer to form a top coating.

2. A process according to claim 1, additionally comprising applying a protective coating to said top coating.

3. A process according to claim 1, wherein said plasma deposition takes place by placing the substrate in the vacuum chamber having an initial pressure of no more than about $10^{-4}$ millibars, flooding the chamber with process gas to produce a pressure of $P_p$ of about 1 to $10^3$ millibars, and forming a plasma at said pressure $P_p$.

4. A process according to claim 3, wherein the powdered lacquer top coating is burned on for a period of about 8 to 30 minutes.

5. A process according to claim 1, wherein the top coating is burned on at a temperature of about 120° to 240° C.

6. A process according to claim 1, wherein the powdered lacquer is applied electrostatically or by sintering.

7. A process according to claim 6, wherein the sintering is vortex sintering.

8. A process according to claim 1, wherein the top coating has a thickness of about 25 to 125μ.

9. A process according to claim 1, wherein the plasma is generated or induced by high frequency, direct current, single cathode vaporization, double cathode vaporization, arc vaporization, or laser.

10. A process for coating a substrate with a metal giving a polished effect, the substrate being dimensionally stable at a temperature of at least 120° C., comprising the steps of:

a) forming a base coating on the substrate by burning on a powdered lacquer;

b) coating the base coat on the substrate with the metal giving the polished effect by plasma deposition in a vacuum chamber; and c) coating the metal coated substrate by burning on a powdered lacquer to form a top coating.

11. A process according to claim 10, wherein the base coating is formed by applying a powdered lacquer to the substrate and burning on by heating the substrate with powdered lacquer to a temperature of about 120° to 240° C.

12. A process according to claim 11, wherein the powdered lacquer base coating is burned on for a period of about 8 to 30 minutes.

13. A process according to claim 10, wherein the base coating has a thickness of about 25 to 125μ.

14. A process according to claim 10, wherein the coatings applied to the substrate have a total thickness of about 50 to 250μ.

* * * * *